United States Patent [19]
Haferl

[11] 4,048,544
[45] Sept. 13, 1977

[54] SWITCHED VERTICAL DEFLECTION SYSTEM

[75] Inventor: Peter Eduard Haferl, Zurich, Switzerland

[73] Assignee: RCA Corporation, New York, N.Y.

[21] Appl. No.: 595,809

[22] Filed: July 14, 1975

[30] Foreign Application Priority Data

Feb. 20, 1975 United Kingdom ............ 07161/75

[51] Int. Cl.² .................... H01J 29/70; H01J 29/76
[52] U.S. Cl. ................................. 315/408; 315/399
[58] Field of Search ............ 315/399, 387, 388, 408, 315/370, 391, 393, 378; 307/228; 328/187

[56] References Cited

U.S. PATENT DOCUMENTS

| | | | |
|---|---|---|---|
| 2,760,109 | 8/1956 | Schade | 315/399 |
| 2,916,665 | 12/1959 | Schlesinger | 315/399 |
| 2,956,202 | 10/1960 | Rhodes | 315/393 |
| 3,700,958 | 10/1972 | Haferl | 315/371 |
| 3,916,254 | 10/1975 | Worster et al. | 315/371 |
| 3,968,403 | 4/1976 | Ogawara | 315/371 |

Primary Examiner—Maynard R. Wilbur
Assistant Examiner—T. M. Blum
Attorney, Agent, or Firm—Eugene M. Whitacre; Paul J. Rasmussen

[57] ABSTRACT

First and second controllable switching stages are respectively coupled between a source of horizontal retrace pulses and a capacitor connected across a vertical deflection winding. A modulator is coupled to the switching stages for controlling the timing of conduction thereof relative to the timing of the horizontal retrace pulses. One switching stage charges the capacitor in one polarity with pulses of current of gradually decreasing amplitude and duration during a first portion of the vertical trace interval and the other switching stage charges the capacitor in the opposite polarity with pulses of current of gradually increasing amplitude and duration during a second portion of the vertical trace interval. The capacitor supplies scanning current of first and second polarities to the vertical deflection winding during respective first and second portions of each vertical trace interval.

11 Claims, 20 Drawing Figures

SWITCHED VERTICAL DEFLECTION SYSTEM

BACKGROUND OF THE INVENTION

This invention relates to vertical deflection circuits and more particularly to switched mode vertical deflection circuits.

Most vertical deflection systems for television receiver use include linear amplifiers for amplifying a sawtooth voltage wave. The output stages in such systems may use single-ended or push-pull circuit configurations for driving a sawtooth of current through the vertical deflection winding. Measurements have shown that the vertical deflection output stage dissipates power in amounts which in some cases may be up to twice or more of the power consumed by the deflection winding.

More efficient vertical deflection circuits have been proposed utilizing class-D operated amplifier output circuits. In a class-D amplifier the output transistors are operated as switches, and since the transistors usually are either nonconducting or saturated when so operated, the power dissipation in the transistors is reduced. To achieve the required vertical rate scanning current waveform, it is common to pulse-width modulate a higher frequency signal, such as the horizontal rate signal or a multiple thereof, at the vertical deflection rate and use these pulse-width modulated signals to drive the class-D output stages. To remove the horizontal rate component from the vertical scanning current sometimes it is necessary to utilize filter networks which consume a relatively large amount of power, thereby offsetting the advantages of a class-D amplifier to some extent.

Another serious consideration in the use of class-D amplifiers is the minimizing of crossover distortion. Crossover distortion occurs when the scanning current sawtooth waveform is not linear when it passes through zero and reverses polarity at the middle of the vertical trace interval. Such distortion resulting from the nonlinear current manifests itself as an increased intensity horizontal bar across the center of the viewing screen. In other situations in which the class-D circuits produce a horizontal rate triangular current component on the vertical scanning current a diagonal line may appear on the viewing screen.

SUMMARY OF THE INVENTION

A vertical deflection circuit includes switches which are controlled for applying successively smaller portions of the horizontal retrace pulse energy during one portion of the vertical deflection cycle and successively greater portions of the horizontal retrace pulse energy during another portion of the vertical deflection cycle to the vertical deflection winding for developing a sawtooth current therein.

A more complete description of the invention together with a description of additional advantages thereof is given in the following description in conjunction with the accompanying drawing of which:

DESCRIPTION OF THE INVENTION

Figure 1:
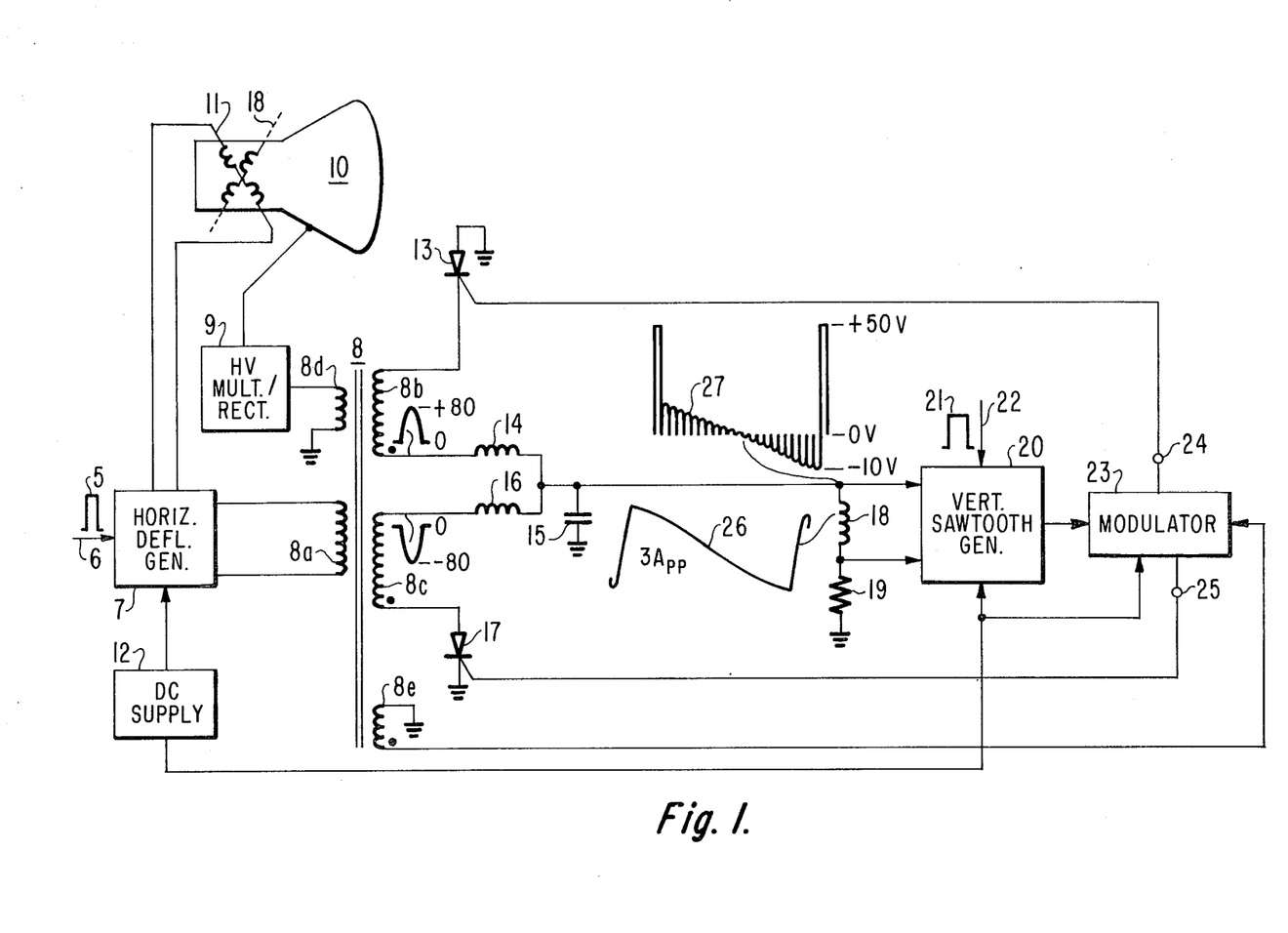
FIG. 1 is a schematic and block circuit diagram of a switched vertical deflection system embodying the invention.

FIG. 1 shows a switched mode vertical deflection circuit which, for example, may be incorporated in a television receiver. Horizontal sync pulses 5 from a sync separator, not shown, are coupled to an input terminal 6 of a horizontal deflection generator 7. Horizontal deflection generator 7 may be any suitable type for supplying horizontal deflection current to a horizontal deflection winding 11 mounted adjacent to a cathode ray tube 10 as well as supplying horizontal rate pulses for various functions within a television receiver. A primary winding 8a of a horizontal output and high voltage transformer 8 receives energy from generator 7. A tertiary winding 8d of transformer 8 supplies retrace pulses to a high voltage multiplier and rectifier assembly 9 which provides a high DC voltage to the ultor terminal of cathode ray tube 10.

On the secondary side of transformer 8 there are serially connected an SCR 13, a secondary winding 8b providing horizontal retrace pulses of approximately 80 volts, an inductance 14, an inductance 16, a second secondary winding 8c providing horizontal retrace pulses of approximately 80 volts and a second SCR 17. The anode of SCR 13 and the cathode of SCR 17 are grounded. The junction of inductances 14 and 16 is coupled through a capacitor 15 to ground and also through a vertical deflection winding 18 and a current sampling feedback resistor 19 to ground. The connections from either side of vertical deflection winding 18 to a vertical sawtooth generator 20 provide feedback for purposes to be described in conjunction with FIGS. 3 and 5.

Vertical deflection rate sync pulses 21 also derived from the sync separator are coupled to an input terminal 22 of the vertical sawtooth generator 20 to synchronize the operation thereof. Output signals obtained from vertical sawtooth generator 20 are coupled to a modulator 23. A source of direct current 12 is coupled to horizontal generator 7, vertical sawtooth generator 20 and modulator 23 and supplies operating current thereto.

Horizontal rate pulses obtained from a winding 8e of horizontal transformer 8 are also coupled to modulator 23. Output signals obtained from modulator 23 are coupled through a terminal 24 to the gate electrode of SCR 13 and through output terminal 25 to the gate electrode of SCR 17.

Figure 2A:
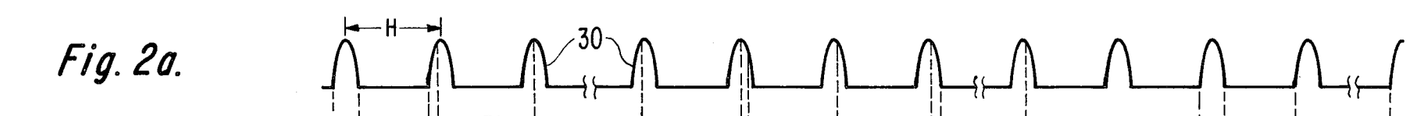
FIGS. 2a-2h illustrate waveforms obtained at various points in the system of FIG. 1.
Figure 2B:
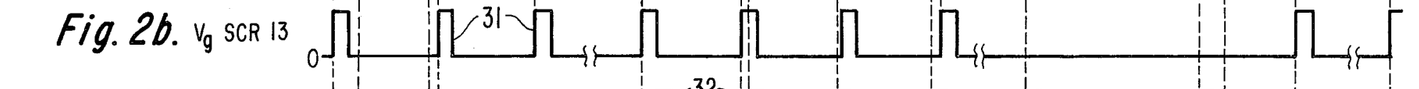
Figure 2C:
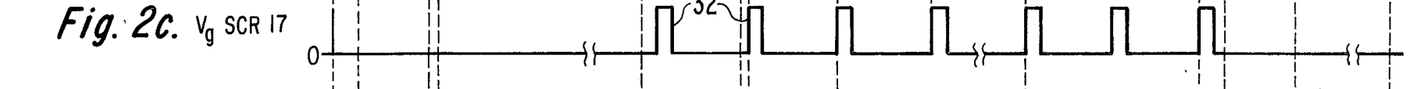

FIGS. 2a-2h illustrate waveforms obtained at various points in the circuit of FIG. 1. In FIG. 2a pulses 30 illustrate horizontal rate retrace pulses such as are obtained at windings 8b, 8c and 8e of horizontal output and high voltage transformer 8. Pulses 31 of FIG. 2b are obtained from modulator 23 and coupled through terminal 24 to the gate electrode of SCR 13 to enable conduction thereof. Pulses 32 of FIG. 2c are coupled through terminal 25 to the gate electrode of SCR 17 to enable conduction thereof. By inspection of FIGS. 2b and 2c, it can be seen that modulator 24 produces output pulses 31 and 32 which have leading edges that vary in time with respect to the leading edges of the retrace pulses 30. The leading edges of pulses 31 are continuously delayed relative to the leading edges of retrace pulses 30 from the beginning until sometime after the center of scan and then ceases. The leading edges of pulses 32 are continuously advanced relative to the leading edges of retrace pulses 30 from sometime before the center until the end of scan.

The SCR gate control pulses 31 and 32 of FIGS. 2b and 2c associated with the circuit of FIG. 1 are shown to have the same width, with their leading and trailing edges varying in time during the vertical interval relative to the leading edges of the horizontal retrace pulses. Such pulse trains can be generated by any suitable pulse position modulator. Such an equal width pulse train is satisfactory because when SCRs are utilized as switches it is necessary only to gate them on initially, conduction then being controlled only by the forward current through the SCRs.

The leading edges of pulses 31 of FIG. 2b occurring during the first part of the trace interval $T_O - T_9$ enable SCR 13 for conduction. The retrace pulses appearing across winding 8b act as a voltage source positive at the bottom terminal of winding 8b relative to its top terminal which provides conventional current flow from the bottom terminal of winding 8b through inductor 14 and capacitor 15 to ground, and through SCR 13 from its anode to cathode to the negative terminal of transformer winding 8b. This charges capacitor 15 positive with respect to ground. SCR 13 begins to conduct when its gate electrode is forward biased by a pulse 31 and continues to conduct as long as forward current flows in its anode-cathode path.

Figure 2D:
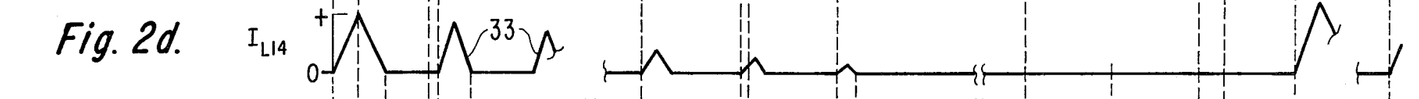

The inductor 14 and capacitor 15 form a series resonant circuit for charging capacitor 15. The slope of the increase and decrease of the current through inductor 14, illustrated by the waveform 33 of FIG. 2d, is determined by the resonant frequency of inductor 14 and capacitor 15.

The resonant frequency of inductor 14 and capacitor 15 as well as that of the circuit comprising inductor 16 and capacitor 15 is chosen to be less than the horizontal deflection frequency to prevent undesirable oscillations. Upon termination of the horizontal retrace pulse the current 33 starts to change at a lesser slope, $T_1 - T_2$, than the slope from $T_0 - T_1$ because winding 8b is no longer a retrace pulse voltage source but a source of opposite polarity trace voltage and the transformed inductance is greater during trace which decreases the resonant circuit frequency. SCR 13 turns off when the current of waveform 33 reaches zero, such as at $T_2$. At this time, the voltage across capacitor 15 has reached its maximum as indicated by waveform 35 of FIG. 2f. At the horizontal rate, the inductance of vertical deflection winding 18 which is in parallel with capacitor 15 is so large that it has little effect on the above-described resonant charging circuits for capacitor 15.

Deflection current is obtained by discharging capacitor 15 via winding 18 which integrates the horizontal rate voltage across capacitor 15 to a substantially sawtooth current at the vertical rate. Although the voltage 35 is shown as returning to ground at the beginning of the gate pulses, the voltage 35 actually returns to a voltage value slightly above or below ground, depending on the resonance of winding 18 because during $T_2 - T_4$ the parallel connection of capacitor 15 and winding 18 is disconnected from the rest of the circuit. However, as shown in more detail in FIG. 3, the DC feedback stabilizes the operating point of the deflection circuit and the AC feedback controls amplitude and linearity of the deflection circuit. Deflection winding 18 provides a discharge path across capacitor 15. Due to the large inductance of winding 18, the discharge current cannot follow the triangular voltage across capacitor 15. Consequently, the current through winding 18 averages the voltage across capacitor 15. Therefore, winding 18 acts as a current sink to discharge capacitor 15, resulting that voltage 35 decreases linearly during the interval $T_2 - T_4$, etc. The parallel resonant frequency of capacitor 15 and vertical deflection winding 18 also determines the vertical retrace interval. The discharge current of capacitor 15 through winding 18 represents the integral of the voltage waveform 35 and as a result of which integration the current through winding 18 is slightly parabolic in shape at the horizontal rate as illustrated in FIG. 2g showing the deflection current 36. Assuming a fixed inductance of winding 18 the amplitude of the parabolic component is inversely proportional to the value of capacitor 15.

As the vertical deflection interval proceeds, modulator 23 produces pulses 31 for SCR 13 which have leading edges increasingly delayed in time relative to the leading edges of the horizontal retrace pulses 30. Hence the conduction time of SCR 13 begins later and later from the beginning of each horizontal retrace pulse 30 of FIG. 2a. This results in a decreasing charging current through inductor 14 and a decreasing voltage 35 across capacitor 15. It follows that the current through deflection winding 18 likewise decreases. Current waveform 36 crosses over the zero axis at $T_7$.

Prior to this time modulator 23 started producing pulses 32 to enable conduction of SCR 17. A gating pulse 32 starting slightly after $T_6$ is coupled through terminal 25 to enable conduction of SCR 17. SCR 17 conducts from its anode to cathode to ground up through capacitor 15 through inductance 16 to the top terminal of winding 8c which has a negative polarity retrace pulse relative to its bottom terminal. Hence, conduction of SCR 17 charges capacitor 15 in a direction to place a negative charge across capacitor 15 relative to ground. Since SCR 17 conducts longer than SCR 13 as determined by the respective enabling pulses 32 and 31 during the time beginning at $T_8$, the net charge on capacitor 15 now becomes negative.

During the period when both SCRs 13 and 17 conduct, generally around $T_6 - T_9$, only the difference between the positive and negative currents 33 and 34 will charge capacitor 15. The remainder of the two currents circulate in a quiescent path comprising SCR 13, winding 8b, inductance 14, inductance 16, winding 8c and SCR 17.

Figure 2E:
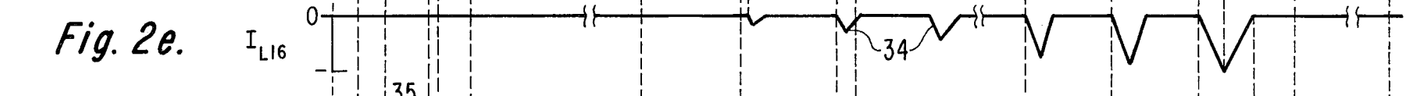

The charging current through inductance 16 for capacitor 15 as illustrated by waveform 34 in FIG. 2e increases for the remainder of the vertical trace interval ending at $T_{11}$. Thus, the negative voltage excursions across capacitor 15 increase during this interval and likewise the negative current through deflection winding 18 as illustrated by waveform 36 of FIG. 2g.

FIG. 2h illustrates the voltage acros SCR 13 during the vertical deflection cycle. During $T_0 - T_2$ SCR 13 conducts the retrace pulse current and the current stored in inductor 14 and winding 8b at the end of the retrace pulse at $T_1$. $T_2 - T_3$ of waveform represents the SCR recovery time when current waveform 33 is zero and the voltage waveform 35 is decreasing from a peak. During $T_3 - T_4$, a negative portion of the retrace pulse appears across SCR 13 as it is not yet switched on. At $T_4$, waveform 31 gates SCR 13 on and it again conducts.

It is to be understood that the voltage waveform across SCR 17 would be a mirror image waveform of opposite polarity of waveform 37.

In FIGS. 2d and 2e, overlapping charging currents are shown for only two periods of SCR gating pulses 31 and 32. Since there are about 262 horizontal retrace pulses during each complete vertical deflection cycle, $T_0 - T_0'$, actually there may be many overlapping portions of charging currents 33 and 34. Thus, crossover is very smoothly and linearly achieved because the difference between currents 33 and 34 decreases to zero at the crossover point. Due to the reactive elements in the circuit, such as capacitor 15, crossover may actually be shifted a slight amount from point $T_7$ indicated in deflection yoke winding current waveform 36.

Vertical retrace is obtained by one-half cycle of the free ringing parallel resonant circuit formed by capacitor 15 and winding 18. By this, the voltage across winding 18 and the magnetic field in winding 18 change their polarity.

It is noted that there are no charging currents during the vertical retrace interval $T_{11} - T_0'$ except for a single charging cycle through SCR 13 and inductance 14, which charging cycle initiates the vertical retrace interval. This is because modulator 23 responds to the waveforms coupled from vertical sawtooth generator 20 to inhibit the gating pulses at terminal 25 which would normally enable SCR 17 to conduct and initiates gating pulses at terminal 24. SCR 13 will conduct heavily and causes the rapid change of voltage polarity across capacitor 15. Then, the vertical retrace pulse shown in waveform 35 during $T_{11} - T_0'$ reverse biases SCR 13 and prevents it from conducting during the remainder of the vertical retrace interval.

Significant power dissipation reduction is achieved in the circuit of FIG. 1 because SCRs 13 and 17 are operated as switches, i.e., either nonconducting or saturated. Hence, little power is dissipated in the devices. Further, no external direct current power supply is required to operate the SCRs 13 and 17. The energy sources for the SCRs are the horizontal retrace pulses appearing across windings 8b and 8c. This results in a further power consumption reduction in that no rectifier and filter networks with their attendant power consumption are required for operation of the circuit.

The loading of the horizontal deflection circuit by the vertical deflection circuit during each horizontal retrace period results in at least some side pincushion correction because the current drain (loading) is greatest at the beginning and end of the vertical trace interval and decreases to a minimum at the center of the vertical trace interval. At least some top and bottom pincushion correction is also provided with no additional circuitry by virtue of the parabolic modulation of the vertical deflection current at a horizontal rate caused by the integration of the voltage across capacitor 15 by the inductance of deflection winding 18. This parabolic component is greatest at the beginning and end of the vertical trace interval and diminishes toward the center of the vertical trace interval providing the commonly referred to "bow tie" modulation for effecting top and bottom pincushion correction of the scanned raster. This is clearly illustrated by deflection winding 18 voltage waveform 27 of FIG. 1.

Figure 3:
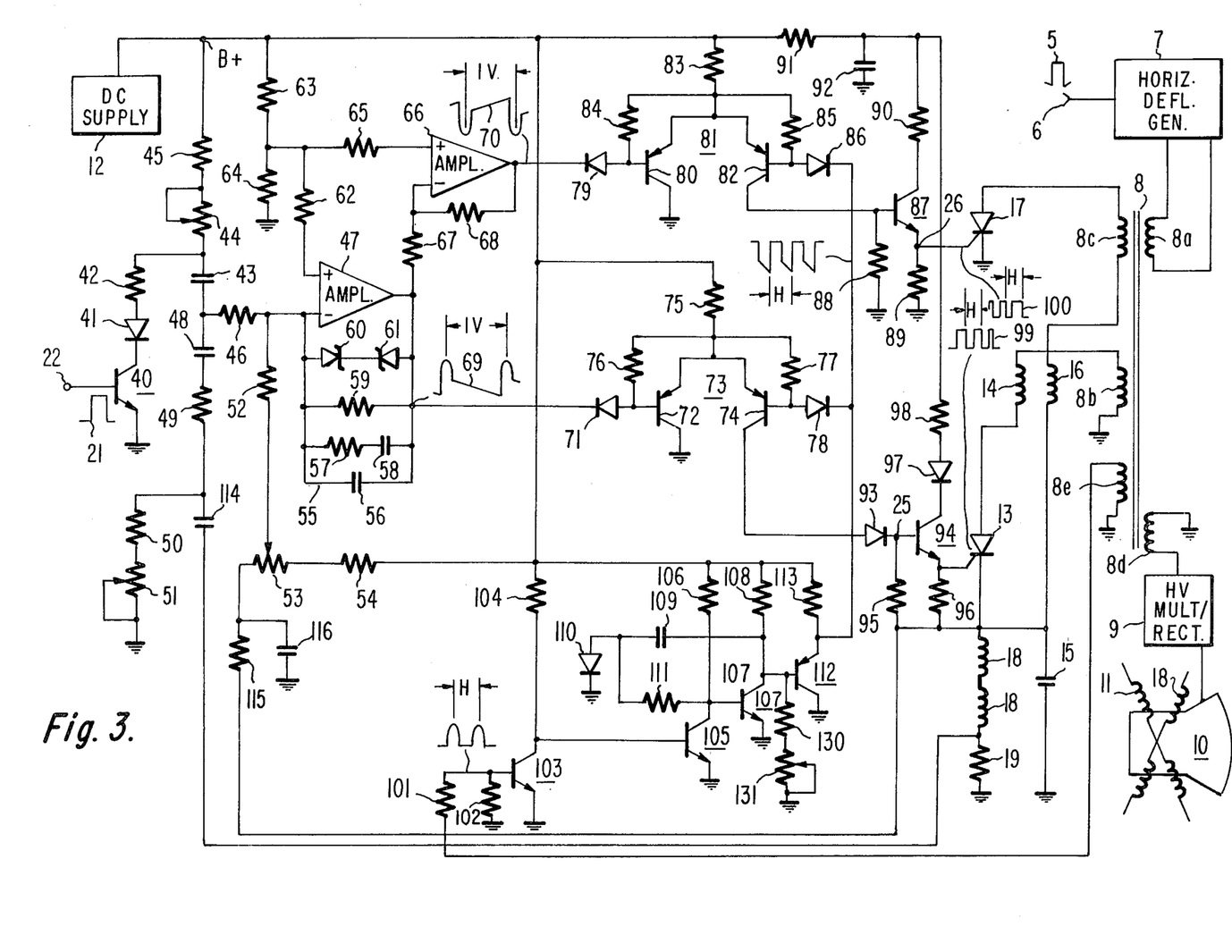
FIG. 3 is a more detailed schematic and block circuit diagram of a switched vertical deflection system embodying the invention.

FIG. 3 is a block and schematic diagram showing in more detail a switched vertical deflection system similar to that shown in FIG. 1. A source of vertical sync pulses 21 is coupled to a terminal 22 of a transistor 40.

The emitter of transistor 40 is grounded and its collector electrode is coupled through a diode 41, a resistor 42, a potentiometer 44 serving as a height control, and a resistor 45 to a source of positive potential B+ obtained from DC supply 12. B+ may be in the order of 24 volts. The junction of resistors 42 and 44 is coupled through a first capacitor 43, a second capacitor 48, a resistor 49, a resistor 50 and a potentiometer 51 serving as a linearity control to ground. The junction of capacitors 43 and 48 is coupled through a resistor 46 to an inverting terminal of an amplifier 47. A resistor 52 couples the inverting terminal of amplifier 47 to a centering potentiometer 53 which in turn is connected through a resistor 54 to B+. Coupled across the inverting input terminal and the output terminal of amplifier 47 are two back-to-back zener diodes 60 and 61 for limiting the peak excursion of the signals. A resistor 59 provides feedback for the amplifier, and series coupled resistor 57 and capacitor 58 in parallel with capacitor 56 serve a damping function to prevent undesirable oscillation or ringing in amplifier 47. Series coupled resistors 63 and 64 between B+ and ground form a DC voltage divider for developing a reference voltage which is coupled through a resistor 62 to the non-inverting input terminal of amplifier 47 and through a resistor 65 to the non-inverting terminal of a second amplifier 66. The output terminal of amplifier 47 is coupled through a resistor 67 to the inverting input terminal of amplifier 66. A resistor 68 coupled from the output terminal of amplifier 66 to its inverting input terminal provides feedback for the amplifier.

The output terminal of amplifier 47 is coupled through a diode 71 to the base electrode of a first transistor 72 of a differential amplifier 73. Differential amplifier 73 performs a pulse width modulation function to be described subsequently. The collector of transistor 72 is grounded and the emitter electrode of transistors 72 and 74 are coupled through a common emitter resistor 75 to B+. Biasing resistors 76 and 77 are coupled from the common emitter junction to the respective bases of transistors 72 and 74. The collector electrode of transistor 74 provides an output signal which is coupled through a diode 93 to the base of a driver transistor 94. The base electrode of transistor 74 is coupled through a diode 78 to the emitter of a transistor 112 and through a diode 86 to the base electrode of a transistor 82 which forms a part of a second differential amplifier 81 which also acts as a pulse width modulator to be described subsequently. The emitters of transistor 82 and transistor 80 are coupled through a common resistor 83 to B+. Biasing resistors 84 and 85, respectively, are coupled from the emitters of transistors 80 and 82 to their bases. The base of transistor 80 is coupled through a diode 79 to the output terminal of amplifier 66. The collector electrode of transistor 82 is coupled to the base of a second driver transistor 87.

Driver transistor 87 has its collector coupled through a resistor 90 to the B+ supply. Resistor 91 and capacitor 92 serve to decouple this stage from the B+ supply. The emitter of transistor 87 is coupled through a resistor 89 to ground and to the gate electrode of an SCR 17.

Driver transistor 94 has its collector electrode coupled through a diode 97 and a resistor 98 to the B+ supply. The emitter electrode of transistor 94 is coupled to the gate electrode of an SCR 13 and through a resistor 96 to the junction of a vertical deflection winding 18 and a capacitor 15. The other terminal of capacitor 15 is grounded and the other terminal of deflection winding 18 is coupled through a current sampling feedback resistor 19 to ground. DC signal obtained from the top of vertical deflection winding 18 is coupled through a series resistor 115 and a shunt capacitor 116 to a terminal of potentiometer 53 to be fed back to amplifier 47. This DC feedback sets the operating point of the DC coupled vertical deflection circuit. An AC feedback path is coupled from the junction of vertical deflection winding 18 and feedback resistor 19 through a capacitor 114 to the junction of resistors 49 and 50. This feedback path serves to provide linearity correction in conjunction with the setting of linearity potentiometer 51.

The output stages including SCRs 13 and 17 and high voltage and output transformer 8 are similar to those described in conjunction with FIG. 1.

A winding 8e of transformer 8 is coupled through a voltage divider comprising resistor 101 and resistor 102 to ground. The junction of resistors 101 and 102 provides horizontal rate retrace pulses at the base of a transistor amplifier 103. The emitter of transistor 103 is grounded and its collector is coupled through a load resistor 104 to B+. The collector of transistor 103 is coupled to the base of a transistor 105 to provide drive current thereto. The emitter of transistor 105 is grounded and its collector is coupled through a resistor 106 to B+ and to the base of transistor 107. The emitter of transistor 107 is grounded and its collector is coupled through a resistor 108 to B+ and through a capacitor 109 and a diode 110 poled as indicated to ground. A resistor 111 is coupled to the collector of transistor 105 and the junction between capacitor 109 and resistor 110.

The collector transistor 107 is further coupled to the base of a transistor 112 connected in circuit as an emitter-follower stage. The collector of transistor 112 is grounded and its emitter is coupled through a resistor 113 to B+. Generally, transistors 103, 105, 107 and 112 and their associated circuitry function to provide sawtooth signals at the horizontal deflection rate which are coupled through diodes 78 and 86 to one input terminal of each of diferential amplifier 73 and 81, respectively. The base of transistor 112 is coupled to the collector of transistor 107 through series connected resistor 130 and potentiometer 131 to ground. Potentiometer 131 provides for overlapping operation of SCR 13 and SCR 17.

During operation, the positive going vertical sync pulses coupled to the base of transistor 40 cause it to conduct which discharges the sawtooth charging capacitors 43 and 48. To begin the vertical trace interval at the termination of vertical sync pulse 22, transistor 40 is cut off and capacitors 43 and 48 charge through a path from the B+ supply through resistor 45, potentiometer 44, resistor 49, capacitor 114 and resistor 19 to ground. The sawtooth wave is coupled through resistor 46 to amplifier 47 and any difference between it and the sawtooth waveform fed back through capacitor 114 appears inverted at the output terminal of amplifier 47, as illustrated by the error signal which is indicated as a vertical rate negative going sawtooth wave form 69. Adjustment of the centering potentiometer 53 varies the DC level of the sawtooth waveform at the input of amplifier 47 and because of the direct current coupling to the deflection winding 18 provides a DC component to achieve centering of the raster by adding a DC component to the deflection yoke current. Additionally, the DC feedback from the top of winding 18 through resistor 115 to one side of centering potentiometer 53 provides stability of the DC operating point.

The negative going sawtooth waveform 69 obtained at the output terminal of amplifier 47 is coupled to the inverting terminal of amplifier 66 which provides at its output terminal an error signal which is illustrated as a positive going vertical rate sawtooth waveform 70 with the same but opposite polarity level as the DC level of waveform 69, referring to the reference voltage established at the junction of resistors 63 and 64. The opposite polarity vertical rate sawtooth waveforms 69 and 70 are coupled through diodes 71 and 79, respectively, to form the other input of respective differential amplifiers 73 and 81.

Figure 4A:
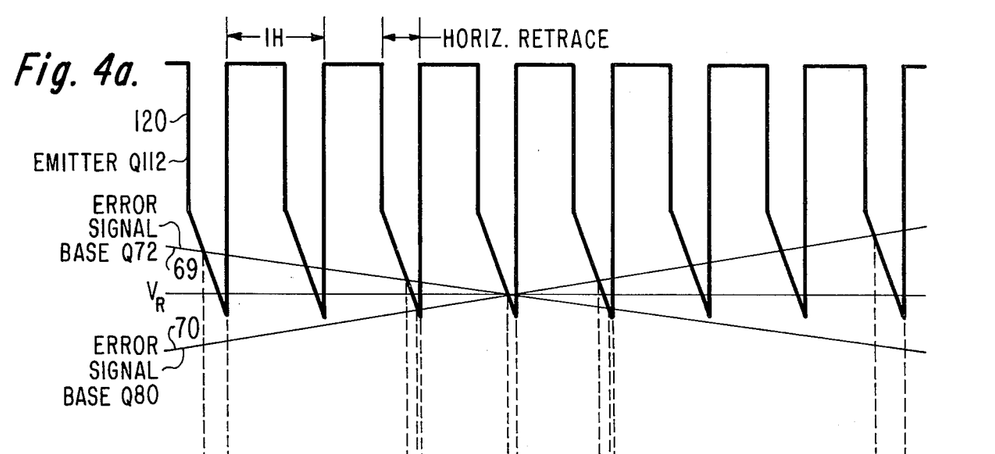
FIGS. 4a-4c illustrate waveforms obtained at various points in the circuit of FIG. 3.
Figure 4B:
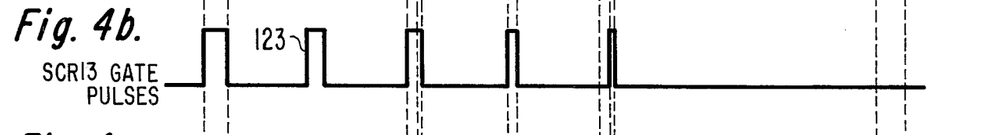
Figure 4C:
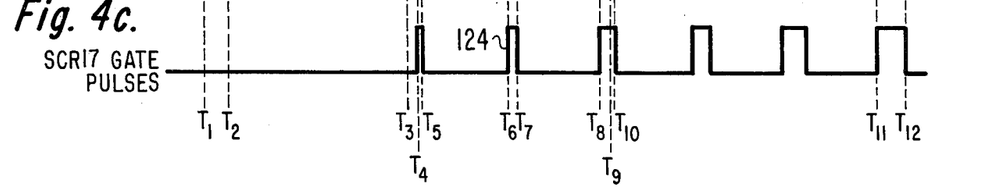

FIGS. 4a –4c illustrate waveforms obtained at various points in the circuit of FIG. 3. Waveform 69 of FIG. 4a is a portion of the negative going sawtooth error waveform applied to the base electrode of transistor 72 of differential amplifier 73. Waveform 70 of FIG. 4a is a portion of the positive going vertical rate sawtooth error waveform coupled to the base electrode of transistor 80 of differential amplifier 81.

The positive going horizontal retrace pulses coupled to the base of transistor 103 cause it to conduct and the inverted retrace pulses are coupled to the base of transistor 105 which cuts off during the horizontal retrace interval. The positive rise of voltage at the collector of transistor 105 causes transistor 107 to conduct. The positive charge on the right hand side of capacitor 109, which had previously been established by the voltage divider comprising resistors 108, 130 and potentiometer 130 connected between B+ and ground is suddenly lowered by the conduction of transistor 107 and the drop appears as a negative voltage at the junction between capacitor 109 and diode 110. The current which was previously flowing through resistor 106 and transistor 105 now divides between the base-emitter junction of transistor 107 and through resistor 111 to the negative side of capacitor 109. Thus, capacitor 109 now starts to discharge through transistor 107 to ground, through the B+ source, through current source resistor 106, through resistor 111 to the left (negative) terminal of capacitor 109. In this circuit, which is a modified type of Miller integrator, the current through resistor 111 equals the current through resistor 106, except for the very small amount of current flowing through the base of transistor 107. Resistor 111 has a constant voltage drop across it and provides the negative going step of waveform 120. The constant current discharge of capacitor 109 through transistor 107 provides a negative going sawtooth voltage waveform at the collector of transistor 107 as illustrated by waveform 120 of FIG. 4a. Transistor 112 is connected as an emitter follower and the voltage at its emitter is the waveform 120 of FIG. 4a. The most positive portion of waveform 120 is determined by the setting of potentiometer 131 in the voltage divider network. The sharp negative going drop in waveform 120 is caused by the voltage drop across resistor 111 caused by the current through resistor 106. The abrupt positive going portion of waveform 120 is caused by the termination of the retrace pulses appearing at the base of transistor 103, which causes it to cut off, transistor 105 to conduct and transistor 107 to cut off, bringing the base voltage of transistor 112 and hence the voltage of waveform 120 up to the level determined by the setting of potentiometer 131, to which level capacitor 109 charges from B+ through resistor 108 and diode 110 to ground.

The negative going pulses 120 with negative going sawtooth tips obtained at the emitter of transistor 112 are coupled through diodes 78 and 86 to the bases of transistors 74 and 82, respectively. With regard to differential amplifier 73, the one of transistors 72 and 74 which has the most negative voltage at its base will conduct and the other transistor will cut off. Thus, during the first part of the vertical trace interval when vertical rate waveform 69 of FIG. 4a is positive relative to the negative going sawtooth waveform 120, transistor 74 will conduct, saturating and providing a series of positive going pulses at the horizontal rate at its collector through diode 93 and transistor driver 94 to cause SCR 13 to conduct. The drive pulses at the gate electrode of SCR 13 are illustrated by the pulses 123 of FIG. 4b. In FIGS. 4a and 4b, it can be seen that as the waveform 69 becomes more negative the pulses 123 become shorter and shorter. With reference to FIGS. 4a and 4b, it can be seen that the waveform 120 causes transistor 74 to conduct at the horizontal rate as long as the negative going sawtooth portion of voltage waveform 120 is more negative than the level of vertical rate waveform 69, thus producing drive pulses for enabling conduction of SCR 13 and charging capacitor 15 at a horizontal rate with a substantially linearly decreasing positive current.

At the time interval $T_4$ the horizontal rate sawtooth portion of waveform 120 becomes more negative relative to the positive going vertical rate sawtooth error waveform 70 and transistor 82 will begin to conduct during each horizontal retrace period with the leading edge of its collector voltage increasingly approaching the leading edge of the waveform 120 as the vertical interval progresses as illustrated by the waveform 124 of FIG. 4c. These positive pulses of waveform 124 are coupled through driver transistor 87 and cause SCR 17 to conduct. Current flowing from ground up through capacitor 15 through inductor 16 to the bottom terminal of winding 8c, which has a negative retrace pulse relative to its top terminal and through SCR 17 provides an increasing negative voltage to be developed across capacitor 15 during the latter half of the vertical trace interval.

Referring to FIGS. 4b and 4c, it can be seen that the pulses of waveforms 123 and 124 overlap for an interval around the center of the vertical trace interval. At $T_6$, equal conduction of SCRs 13 and 17 occurs, leaving a net charging current of zero into capacitor 15. This is the crossover point. As previously described, the setting of potentiometer 131 determines the voltage level on which pulses 120 are superimposed and, hence, the number of overlapping pulses of waveforms 123 and 124. It can be seen that the positive and negative currents respectively dominate to create the sawtooth current through deflection winding 18 on the left and right sides, respectively, of $T_6$. The reference voltage $V_R$ shown as centerline in FIG. 4a represents the nominal average DC voltage of the sawtooth waveforms 69 and 70. This reference voltage is determined by the voltage divider formed by resistors 63 and 64 shown in FIG. 3. The setting of the centering control potentiometer 53 causes by virtue of the amplifiers 47 and 66 that the voltage waveforms 69 and 70 shift in opposite polarity directions with reference to $V_R$. This causes the crossover point of waveforms 69 and 70 of FIG. 4a to move in either direction from the center as shown, resulting that the deflection current through winding 18 superimposes on a DC centering current depending upon the setting of potentiometer 53.

Figure 2F:
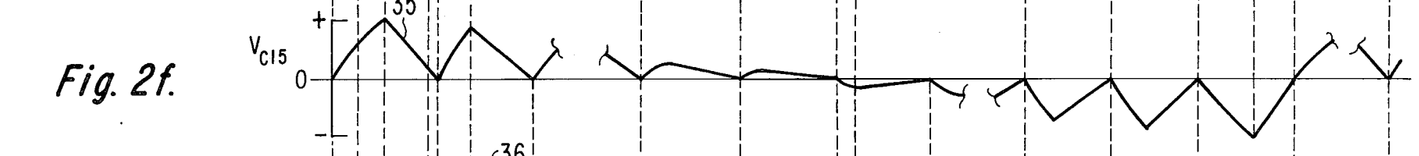
Figures 2G, 2H:
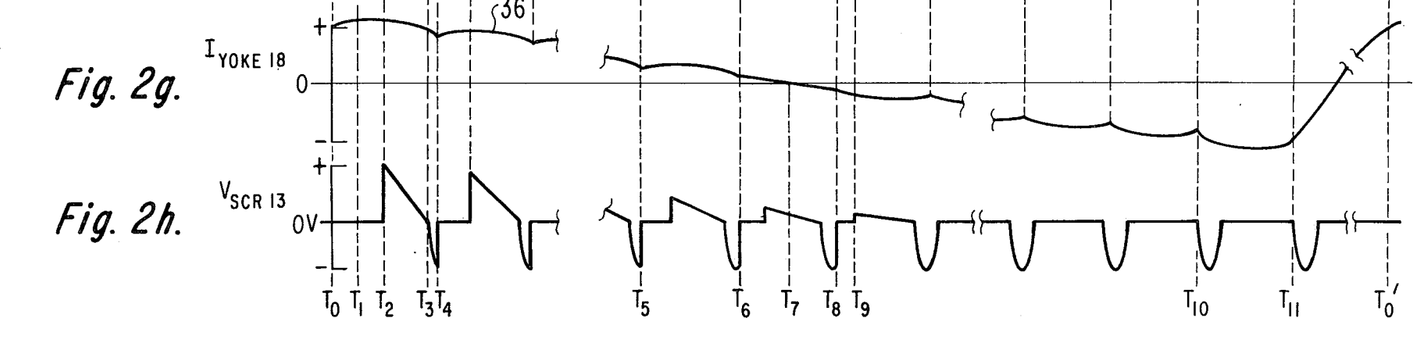

Retrace is initiated by the conduction of transistor 40 which causes the negative pulse portion of vertical rate waveform 70 coupled to the base electrode of transistor 80 of differential amplifier 81 to cause transistor 82 to stop conducting and to stop producing pulses 124. At the same time the positive going portion of waveform 69 coupled to transistor 72 of differential amplifier 73 cuts off transistor 72 and leaves transistor 74 enabled for conduction when the negative going sawtooth waveform 120 at the horizontal rate is applied to its base. The first horizontal sawtooth 120 appearing at this time generates a wide pulse 123 at the collector of transistor 74 and gates SCR 13 to conduct at a very early time with reference to the horizontal retrace pulses 30 of FIG. 2a. The current through SCR 13 charges capacitor 15 positive and the magnetic energy stored in the deflection winding 18 causes the voltage across capacitor 15 to rise further positive. This is illustrated in FIGS. 2b, 2d, 2f and 2g. The retrace pulse time of voltage waveform 35 of FIG. 2f is approximately three to four horizontal lines. The positive going retrace pulse is coupled through biasing resistor 95 to the cathode of diode 93 to reverse bias it with relation to the relatively low level positive going pulses produced at its anode as transistor 74 conducts. Similarly, diode 97 is reverse biased during the vertical retrace interval and disconnects transistor 94 from the B+ supply, allowing the retrace pulse to rise above the B+ level for one-half the cycle determined by the resonant frequency of the parallel combination of capacitor 15 and deflection winding 18. Since the deflection winding is not clamped to any voltage during the retrace interval, the retrace pulse voltage can rise to a relatively high level, causing a quick reversal of deflection winding current and, hence, a short retrace interval. After one-half cycle of resonance the vertical retrace pulse begins to swing negative, forward biasing diodes 93 and 97 and permits gate pulses to be applied to SCR 13, enabling a new trace interval to begin.

In FIG. 3 the cathode of SCR 13 is connected to capacitor 15 instead of the top of winding 8b as in FIG. 1. Thus, in the arrangement of FIG. 3, the cathode and gate electrodes are floating at a much lower voltage than in FIG. 1, resulting in greater stability in the operation of SCR 13.

In FIG. 3, unlike FIG. 1, a pulse width modulator arrangement is utilized to control the conduction of SCRs 13 and 17 with the leading edge only of the pulses of waveforms 123 and 124 being varied relative to the leading edges of the horizontal retrace pulses.

Figure 5:
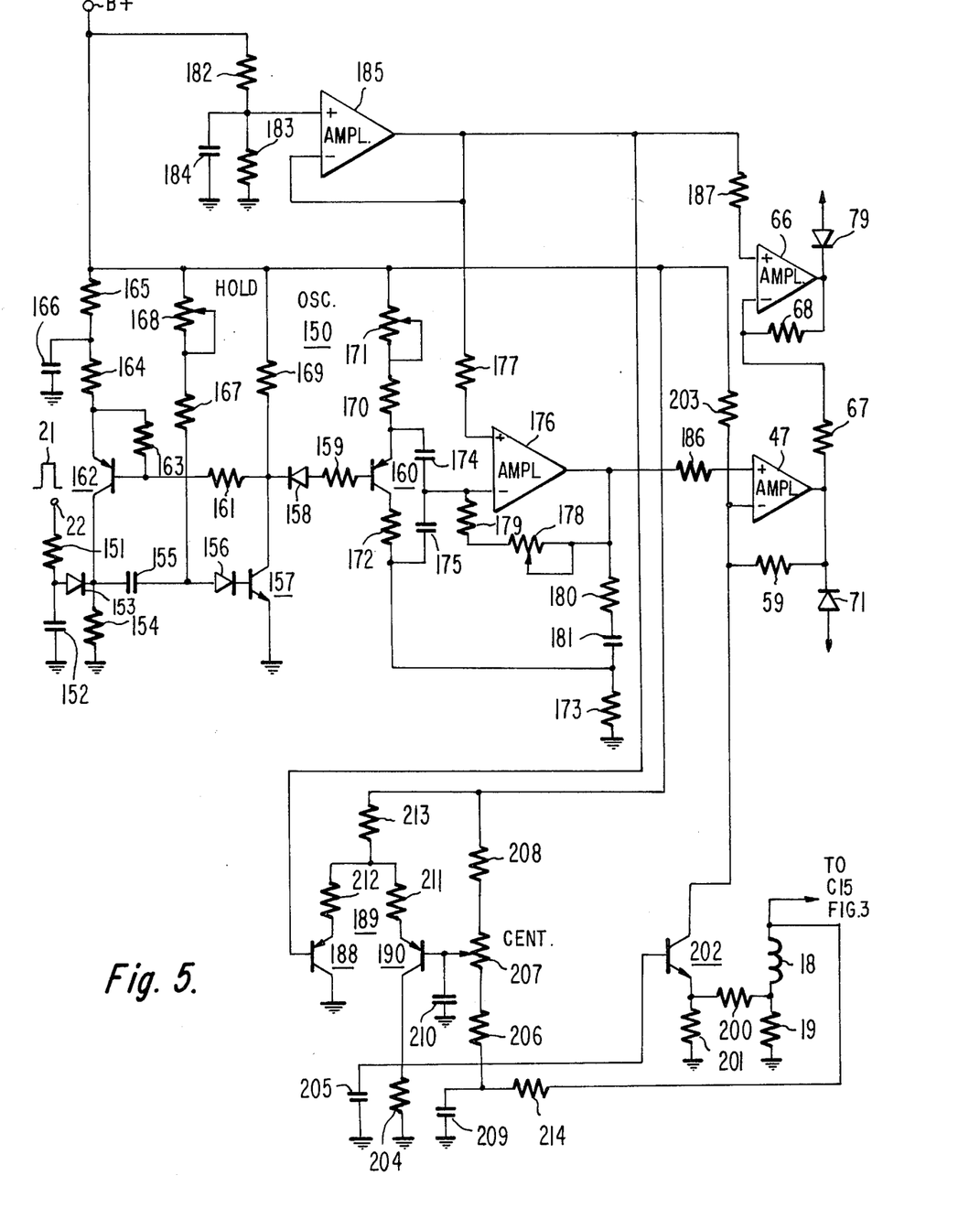
FIG. 5 is a detailed block and schematic circuit diagram of another switched vertical deflection system embodying the invention.

FIG. 5 is a detailed block and schematic circuit diagram of another switched vertical system embodying the invention. The essential difference between the embodiments of FIG. 5 and FIG. 3 is that in FIG. 5 a separate oscillator and sawtooth generator 150 produces a stable sawtooth voltage waveform obtained from an output terminal of an amplifier 176, which waveform is coupled to amplifiers 47 and 66 and the rest of the vertical generator which acts as a linear amplifier, feedback being coupled from the deflection winding 18 to amplifier 47. An advantage of the FIG. 5 embodiment is that interlace of two successive vertical fields is readily accomplished.

A vertical sync pulse 21 is coupled to a terminal 22 and through a resistor 151, a diode 153, a capacitor 155 and a diode 156 to cause transistor 157 to conduct to start the retrace interval. The conduction path of transistor 157 is from the B+ supply through resistor 169 to ground. The drop in potential at the collector of transistor 157 is coupled through diode 158 and resistor 159 to cause transistor 160 to conduct. Transistor 160 conducting discharges sawtooth generating capacitors 174 and 175 through a resistor 172. The emitter-collector current path is completed by the path from B+ through height control potentiometer 171, resistor 170, resistor 172 and resistor 173 to ground. Conduction of transistor 160 during the vertical retrace interval causes a negative going retrace voltage waveform portion to be generated at the inverting input terminal of amplifier 176.

The lowered collector voltage of transistor 157 following the leading edge of sync pulses 21 is coupled through a resistor 161 to cause transistor 162 to conduct. The main conduction path of transistor 162 is from the B+ terminal through resistor 165, resistor 164 and resistor 154 to ground, resistor 154 being in parallel with the series connection of capacitor 155, diode 156 and the base-emitter junction of transistor 157 to ground. This current path allows capacitor 155 to discharge through diode 156 and the base-emitter junction of transistor 157. When capacitor 155 has discharged to a point that diode 156 and the base-emitter junction of transistor 157 are no longer forward biased, transistor 157, transistor 160 and transistor 162 will cut off. At this time capacitors 174 and 175 start forming a sawtooth voltage waveform at their junction by charging from the B+ supply through potentiometer 171, resistor 170 and resistor 173 to ground, forming a negative going sawtooth wave at the output terminal of amplifier 176. At the same time, capacitor 155 starts charging through potentiometer 168 which serves as a hold control, resistor 167 and resistor 154 to ground to determine the free-running frequency of the oscillator portion comprising transistors 162 and 157. In the absence of incoming vertical sync pulses 21, transistor 157 would conduct and initiate vertical retrace when the charge across capacitor 155 became positive enough to forward bias diode 156 and transistor 157. Capacitor 166 coupled from the junction of resistors 164 and 165 to ground serves to decouple the power supply. Capacitor 152 coupled from the junction of resistor 151 and diode 153 to ground serves to decouple any horizontal rate energy from being passed through diode 153.

Resistors 182 and 183 coupled between B+ and ground have their junction coupled to the non-inverting terminal of an amplifier 185 for producing a stable reference voltage at the output terminal of amplifier 185. Capacitor 184 decouples any voltage variations from reaching the non-inverting input terminal of amplifier 185. The output terminal of amplifier 185 is coupled back to its inverting input terminal for feedback purposes and is also coupled through a resistor 177 to supply the reference voltage to the non-inverting input terminal of amplifier 176.

A potentiometer 178 and resistor 179 coupled from the output terminal of amplifier 176 to its inverting terminal provide linearity adjustment of the sawtooth waveform. Resistor 180 and capacitor 181, coupled from the output terminal of amplifier 176 to the bottom terminal of capacitor 175, are selected to provide S-shaping of the generated sawtooth waveform. Thus, the positive going sawtooth waveform at the output of amplifier 176 has its linearity and S-shaping accomplished independently of feedback from the rest of the deflection circuit. This waveform in this embodiment is the equivalent of the positive going sawtooth waveform coupled to the input inverting terminal of amplifier 47 of FIG. 3. The output terminal of amplifier 176 is coupled through a resistor 186 to the non-inverting terminal of amplifier 47 which serves the same function as in FIG. 3. The output terminal of amplifier 47 is coupled through resistor 67 to the inverting terminal of amplifier 66 which also performs the same function as in FIG. 3. The reference voltage obtained at the output terminal of amplifier 185 is coupled through a resistor 187 to the non-inverting input terminal of amplifier 66. Resistors 59 and 68 respectively provide feedback for amplifiers 47 and 66 as in the FIG. 3 embodiment. The output terminals of respective amplifiers 47 and 66 are coupled through diodes 71 and 79, respectively, to the modulators 73 and 81 as in FIG. 3. Therefore, at diode 71 there would be present a negative going sawtooth waveform 69, and at diode 79 an inverted positive going vertical rate sawtooth waveform 70 as in FIG. 3. The remainder of the output circuitry, not shown in FIG. 5, is understood to be the same as in the FIG. 3 embodiment, the only difference being the feedback arrangement from deflection winding 18, which arrangement in FIG. 5 will now be described.

A differential amplifier 189 comprises transistors 188 and 190, the emitters of which are respectively coupled through resistors 212 and 211 and through a resistor 213 to the B+ supply. The collector of transistor 188 is grounded and its base has as an input signal the reference voltage obtained from the output terminal of amplifier 185. This voltage determines the nominal DC operating point for the vertical amplifier. The collector electrode of transistor 190 is coupled through parallelly connected resistor 204 and capacitor 205 to ground and to the base electrode of a transistor 202 operated as a feedback amplifying stage. A resistor 208, a centering potentiometer 270, a resistor 206 and a capacitor 209 are serially coupled in that order between B+ and ground. The wiper arm of centering potentiometer 207 is coupled to the base of transistor 190 and capacitor 210, coupled between the base of transistor 190 and ground, serves to filter any voltage excursions in the base. The junction of resistor 206 and capacitor 209 is coupled through resistor 214 to the high side of vertical deflection winding 18 for receiving DC feedback therefrom for stabilizing the operating point and offsetting it with adjustment of the centering control if desired to cause a direct current component through deflection winding 18. Thus, the DC stability and centering adjustment voltages are compared with the reference voltage obtained from amplifier 185 and the difference is coupled from the collector of transistor 190 to the base electrode of feedback amplifier 202.

Feedback is taken from the junction of deflection winding 18 and feedback resistor 19 and coupled through a resistor 200 to the emitter of transistor 202. Resistor 201, coupled from the emitter of transistor 202 to ground in parallel with resistors 200 and 19 determines the total emitter resistance and controls the current through resistor 203 and transistor 202. This feedback signal controls the deflection current amplitude and linearity. The respective feedback signals coupled to the base and emitter electrodes of transistor 202 alter the conduction of transistor 202 and the voltage developed across load resistor 203 is coupled to the inverting terminal of amplifier 147 to provide the desired operation of the switched vertical deflection system.

Figure 6A:
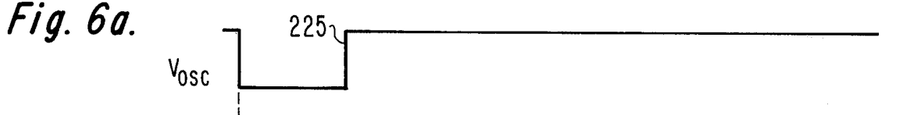
FIGS. 6a-6f illustrate waveforms obtained at various points in the circuit of FIG. 5.

Reference is now made to FIGS. 6a–6f which are waveforms obtained at various points in the circuit of FIG. 5. FIG. 6a illustrates the oscillator voltage waveform 225 obtained at the collector electrode of transistor 157. Since this waveform is synchronized by the vertical synchronizing pulses 21 coupled to the oscillator, waveform 225 necessarily contains interlace timing information. Similarly, the voltage sawtooth waveform 226 of FIG. 6b, which illustrates the voltage obtained at the output of amplifier 176 is likewise synchronized by vertical sync waveform 21 and therefore contains interlace timing information.

Figure 6B:
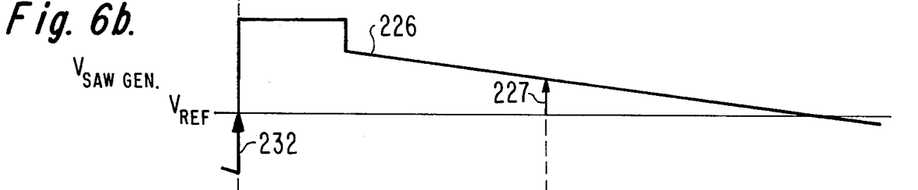
Figure 6C:
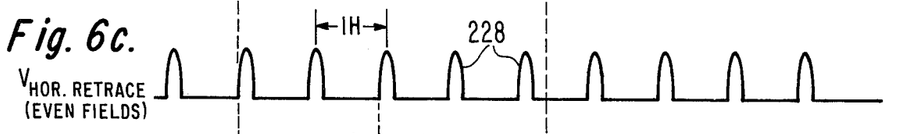
Figure 6D:
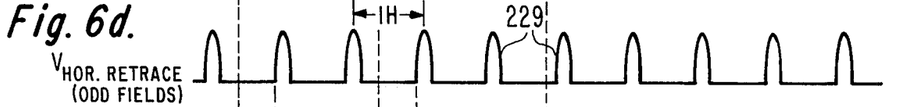

Voltage waveforms 228 and 229, respectively, of FIGS. 6c and 6d indicate the timing of horizontal retrace pulses relative to the vertical rate waveforms of FIGS. 6a and 6b for even and odd fields, respectively. Horizontal pulses 228 are offset one-half a horizontal scanning interval from horizontal rate pulses 229, the offset representing the interlace relationship between the even and odd vertical fields.

Interlaced deflection operation is characterized by same deflection current amplitudes in even and odd fields with reference to the vertical sync pulse timing. Referring to horizontal sync or retrace pulses, the amplitudes of interlaced deflection current are not equal between even and odd fields. There is a deflection current difference equivalent to one-half horizontal line, which difference may amount to several milliamperes. Since the subject deflection circuit is horizontal retrace pulse driven, interlaced operation cannot be obtained by the timing of the vertical retrace as practiced in the prior art deflection circuits. In the present invention interlaced operation is obtained by comparing and adjusting the deflection current amplitude to the amplitude of the reference sawtooth waveform 226 of FIG. 6b at the beginning and throughout each deflection cycle. This is done by the AC feedback around the linear output amplifier as will be explained in more detail in the following.

Figure 6E:
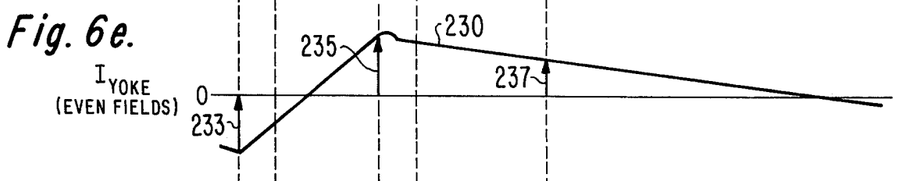
Figure 6F:
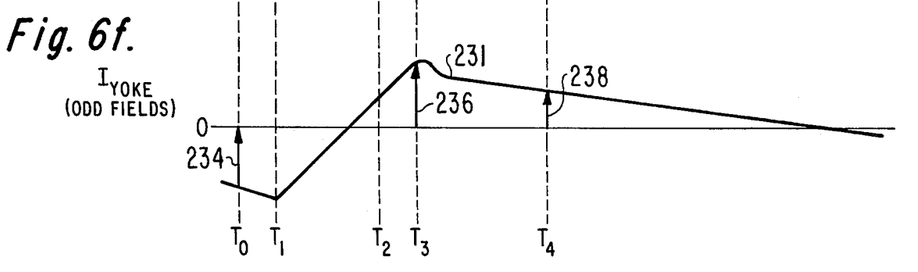

As described in conjunction with FIG. 3, the retrace interval of each vertical deflection cycle is initiated by the first horizontal retrace pulse following the leading edge of waveforms 225 and 226, respectively, of FIG. 6a and 6b. This is so because the deflection current can be changed by the SCRs 13 and 17 only during the presence of horizontal retrace pulses. Assuming interlaced operation, the amplitudes of the deflection current waveforms 230 and 231 of FIGS. 6e and 6f are equal in even and odd fields at the time $T_O$ which indicates the end of the trace interval. This is illustrated by the three vectors 232, 233 and 234 of FIGS. 6b, 6e and 6f having the same lengths. The same deflection current amplitudes at $T_O$ are obtained by the AC feedback around the deflection amplifier, which compares the voltage across the current sampling resistor 19 to the reference sawtooth voltage 226 of FIG. 6b at the input of amplifier 47. As explained above, vertical retrace can only initiate at the first coincidence between the horizontal pulses 228 and 229, respectively, with the vertical pulse 225 superimposed on waveform 226. Thus, in even fields vertical retrace starts at $T_O$ in odd fields at $T_1$. The start of vertical trace is therefore not interlaced. Further, in odd fields more magnetic energy is stored in the deflection winding because the deflection current increases between $T_O$ and $T_1$ as shown in FIG. 6f. During the vertical retrace interval from $T_O$ to $T_2$ for even fields and from $T_1$ to $T_3$ for odd fields the deflection winding 18 connected in parallel with capacitor 15 ring for one-half cycle of their resonant frequency as explained in conjunction with FIG. 3. The stored magnetic energy transfers from winding 18 into capacitor 15 and back to winding 18 thereby causing a large retrace voltage across winding 18 and capacitor 15; further, it changes the polarity of the deflection current from a negative direction at $T_O$ and $T_1$ to a positive direction at $T_2$ and $T_3$.

The different amount of stored magnetic energy at the start of retrace at $T_O$ for even fields and $T_1$ for odd fields results in the retrace voltage amplitude across winding 18 and capacitor 15 varying by a small amount between even and odd fields, being higher in odd fields. Consequently the amplitudes of the deflection current at $T_2$ and $T_3$ is altered also by a small amount between even and odd fields, being higher in odd fields as illustrated by vectors 235 and 236 of FIGS. 6e and 6f, respectively. The amplifier controlled trace interval starts, then SCR 13 is enabled by the decreased retrace voltage across winding 18 and capacitor 15 to be gated in conduction by waveform 123 of FIG. 4b. This occurs just after $T_2$ in even fields and $T_3$ in odd fields. Since the trace interval deflection currents start at different times in the even and odd fields and at different amplitudes at respective times $T_2$ and $T_3$, interlace is provided by adjusting the deflection yoke current by comparing it to the independently generated sawtooth waveform 226 in amplifier 47 of FIG. 5. Thus, the feedback signal obtained from deflection current sampling resistor 19 which would occur with different amplitudes at a given time in the even and odd fields, are compared with the independently generated and interlaced reference sawtooth waveform 226 for providing an error signal to correct the scanning current such that it is equal at a given time relative to vertical sync in both the odd and even fields. This is illustrated at time $T_4$ in FIGS. 6b, 6e, and 6f wherein the vectors 238 and 237 representative of deflection scanning current at $T_4$ during odd and even fields, respectively, are compared with the voltage level 227 at $T_4$ occurring during each even and odd field. Thus, by comparing the non-interlaced vertical trace interval deflection current with an interlaced independently generated voltage sawtooth reference waveform, the scanning current is corrected such that it conforms to the interlaced reference waveform, resulting in properly interlaced scanning current during the even and odd fields.

An advantage of the described vertical deflection circuit is its high efficiency. No direct current power supply is utilized for the output switch stages and hence there can be no power supply dissipation losses. The entire circuits in the described embodiments are DC coupled, resulting in the elimination of the relatively expensive deflection winding coupling capacitor utilized in AC coupled circuits. Further, the DC coupling provides a simple arrangement for centering as the DC operating point of the circuit can readily be adjusted to cause a DC centering current through the deflection winding with no extra circuit components required. If desired, the circuit may be AC coupled without departing from the scope of the invention.

The arrangement for the charging of capacitor 15 permits either low or high impedance vertical deflection windings to be utilized as desired because in either case the deflection winding impedance to the horizontal rate charging current is so high as to have little effect on circuit operation.

Another advantage of the described circuits is no television picture disturbance because the SCR switches are switched on only during the horizontal retrace intervals when the picture tube is blanked and there is no abrupt switching off of the SCR current because switching off is accomplished at substantially zero current when the current in the resonant charging circuits passes through zero.

Also, the described circuits provide at least some side and top and bottom pincushion correction by the respective loading of the horizontal energy at a vertical rate and the generation of a slightly parabolic vertical deflection currrent at the horizontal rate, both without the use of any external pincushion correction apparatus or additional power consumption.

The following is a listing of the circuit element parameters for some of the more critical elements shown in FIGS. 1 and 3.

| L14 | 50 μh | (L14 and L15 may be wound on the same or separate cores) |
|---|---|---|
| L15 | 50 μh | |
| L18 | 36 mh, 2.77Ω | (series connected vertical coils, used with an RCA 63 cm, 110 degree picture tube) |
| C15 | 3 μf | |
| C109 | 4700 μμf | |
| R19 | 0.47Ω | |
| R106 | 22K | |
| R108 | 4.7 K | |
| R111 | 8.2 K | |
| R130 | 10K | |
| R131 | 47K | |

What is claimed is:

1. In a deflection system for cathode ray tubes, said deflection system of the type including a horizontal deflection circuit for deflecting an electron beam of said cathode ray tube in a horizontal direction in response to a horizontal deflection wave, a vertical deflection circuit comprising:
    a vertical deflection winding responsive to a sawtooth current therethrough for deflecting said electron beam of said cathode ray tube in a vertical direction; and
    means for applying successively smaller portions of the energy of said horizontal deflection wave during one interval of said vertical deflection and successively greater portions of said energy of said horizontal deflection wave during a second interval of said vertical deflection to said vertical deflection circuit for producing all of said sawtooth current in said vertical deflection winding, said first and second intervals occurring during the trace portion of each vertical deflection interval.

2. A vertical deflection circuit according to claim 1 wherein said means include controllable switches coupled to said horizontal deflection circuit and to said vertical deflection circuit for providing a current path for said horizontal retrace pulses therebetween.

3. A vertical deflection circuit according to claim 2 wherein a capacitor is coupled in parallel with said vertical deflection winding and to said controllable switches for being charged by said horizontal retrace pulses through said controllable switches and for supplying said sawtooth current in said vertical deflection winding.

4. A vertical deflection circuit according to claim 3 wherein first and second inductances are respectively coupled to first and second of said controllable switches and to said capacitor to form first and second series resonant circuits for charging said capacitor with said horizontal retrace pulse energy.

5. A vertical deflection circuit according to claim 4 wherein said resonant frequency of said first and second series resonant circuits is less than said horizontal rate frequency.

6. A vertical deflection circuit according to claim 5 wherein the resonant frequency of said capacitor in parallel with said vertical deflection winding has a period substantially equal to twice the vertical deflection circuit retrace interval.

7. A vertical deflection circuit according to claim 6 wherein said horizontal deflection retrace pulses are obtained from transformer windings in said horizontal deflection circuit coupled to said first and second controllable switching means.

8. A vertical deflection circuit according to claim 7 wherein modulator means responsive to vertical and horizontal deflection rate signals produce first and second trains of horizontal rate pulses the leading edges of which are successively and respectively delayed from and advanced toward the leading edge of said horizontal deflection retrace pulses and coupled to said first and second controllable switches for respectively controlling the conduction thereof.

9. A vertical deflection circuit according to claim 8 wherein said modulator means produces said first and second trains of horizontal rate pulses which overlap during said vertical deflection interval.

10. A switched vertical deflection system comprising:
    a first series circuit including first and second switches, first and second sources of horizontal deflection rate voltage and first and second inductors;
    a capacitor;
    a second series circuit including said first switch, said first source of horizontal rate voltage, said first inductor and said capacitor;
    a third series circuit including said second switch, and second source of horizontal rate voltage, said second inductor and said capacitor;
    modulator means responsive to horizontal and vertical deflection rate signals for producing overlapping series of respective increasing and decreasing width horizontal rate pulses during each vertical deflection cycle respectively coupled to said first and second switches for controlling the conduction thereof for charging said capacitor to a first polarity through said second series circuit and to a second polarity through said third series circuit, said first series circuit conducting current of first and second polarities from said second and third series circuits such that only the amplitude difference between said first and second currents charges said capacitor when said pulses overlap; and
    a vertical deflection winding coupled to said capacitor for providing a discharge path therefor for producing a substantially linear sawtooth alternating current in said deflection winding during each vertical deflection cycle.

11. A switched vertical deflection system for producing a sawtooth current in a vertical deflection winding, comprising:
    a first series circuit including a first switch, a first source of horizontal retrace pulses, a first inductor and capacitor, said first source of horizontal retrace pulses being poled to cause current to flow in a direction to charge said capacitor in a first polarity direction, said first inductor and said capacitor being tuned to a frequency lower than the frequency of said horizontal retrace pulses;

a second series circuit including a second switch, a second source of horizontal retrace pulses, a second inductor and said capacitor, said second source of horizontal retrace pulses being poled to cause current to flow in a direction to charge said capacitor in a second polarity direction, said second inductor and said capacitor being tuned to a frequency lower than the frequency of said horizontal retrace pulses;

a vertical deflection winding coupled in parallel with said capacitor to form a parallel resonant circuit having a period substantially equal to twice the desired vertical retrace interval;

a source of signals having a frequency equal to the desired vertical deflection rate;

a modulator coupled to receive said horizontal retrace pulses and to said source of signals having a frequency equal to said desired vertical deflection rate for producing first and second sets of timing pulses, said first set of timing pulses occurring during the first half of said sawtooth current interval and having leading edges which occur increasingly later than the leading edges of said retrace pulses, said second set of timing pulses occurring during the second half of said sawtooth current interval and having leading edges which occur increasingly closer to the leading edges of said retrace pulses; and means coupling said first and second sets of timing pulses to said first and second switches, respectively, for initiating conduction of current through said switches at the time of said leading edges of said timing pulses during said sawtooth current interval.

* * * * *

REEXAMINATION CERTIFICATE (65th)

United States Patent [19]

Haferl

[11] B1 4,048,544

[45] Certificate Issued  Mar. 29, 1983

[54] SWITCHED VERTICAL DEFLECTION SYSTEM

[75] Inventor: Peter Eduard Haferl, Zurich, Switzerland

[73] Assignee: RCA Corporation, New York, N.Y.

Reexamination Request

No. 90/000,163, Feb. 17, 1982

Reexamination Certificate for:

| | |
|---|---|
| Patent No.: | 4,048,544 |
| Issued: | Sep. 13, 1977 |
| Appl. No.: | 595,809 |
| Filed: | Jul. 14, 1975 |

[30] Foreign Application Priority Data

Feb. 20, 1975 United Kingdom............ 07161/75

[51] Int. Cl.$^3$.... H01J 29/70; H01J 29/76; H01J 29/72
[52] U.S. Cl. .................................. 315/408; 315/399
[58] Field of Search... 315/408, 399, 393, 315/387, 391

[56] References Cited

U.S. PATENT DOCUMENTS

| | | |
|---|---|---|
| 2,760,109 | 8/1956 | Schade. |
| 2,916,665 | 12/1959 | Schlesinger. |
| 2,956,202 | 10/1960 | Rhodes. |
| 3,134,928 | 5/1964 | Freedman. |
| 3,700,958 | 10/1972 | Haferl. |
| 3,916,254 | 10/1975 | Worster et al. |
| 3,939,380 | 2/1976 | Peer ............................ 315/397 |
| 3,968,403 | 7/1976 | Ogawara ....................... 315/371 |

FOREIGN PATENT DOCUMENTS

| | | |
|---|---|---|
| 1068307 | 5/1967 | United Kingdom. |
| 1076092 | 7/1967 | United Kingdom. |
| 1076093 | 7/1967 | United Kingdom. |
| 1198209 | 7/1970 | United Kingdom. |
| 1289097 | 8/1975 | Fed. Rep. of Germany. |
| 1443038 | 7/1976 | United Kingdom. |
| 1463535 | 12/1966 | France. |
| 1928477 | 6/1969 | Fed. Rep. of Germany. |
| 2055081 | 8/1975 | Fed. Rep. of Germany. |
| 2244277 | 3/1974 | Fed. Rep. of Germany. |
| 2507528 | 8/1975 | Fed. Rep. of Germany. |
| 4718425 | 9/1972 | Japan. |

OTHER PUBLICATIONS

Proceedings of the Leningrad Institute of Electrical Eng., 1973, vol. 123, pp. 48–51.

*Primary Examiner*—Theodore M. Blum

[57] ABSTRACT

First and second controllable switching stages are respectively coupled between a source of horizontal retrace pulses and a capacitor connected across a vertical deflection winding. A modulator is coupled to the switching stages for controlling the timing of conduction thereof relative to the timing of the horizontal retrace pulses. One switching stage charges the capacitor in one polarity with pulses of current of gradually decreasing amplitude and duration during a first portion of the vertical trace interval and the other switching stage charges the capacitor in the opposite polarity with pulses of current of gradually increasing amplitude and duration during a second portion of the vertical trace interval. The capacitor supplies scanning current of first and second polarities to the vertical deflection winding during respective first and second portions of each vertical trace interval.

REEXAMINATION CERTIFICATE ISSUED UNDER 35 U.S.C. 307.

THE PATENT IS HEREBY AMENDED AS INDICATED BELOW.

Matter enclosed in heavy brackets appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 10 and 11 is confirmed.

Claim 1 is determined to be patentable as amended:

1. In a deflection system for cathode ray tubes, said deflection system of the type including a horizontal deflection circuit for deflecting an electron beam of said cathode ray tube in a horizontal direction in response to a horizontal deflection wave, a vertical deflection circuit comprising:

a vertical deflection winding responsive to a sawtooth current therethrough for deflecting said electron beam of said cathode ray tube in a vertical direction; and means for applying *horizontal deflection wave energy portions comprising first and second amounts of energy having mutually opposite directions of flow during the same horizontal intervals to said vertical deflection circuit in order to apply* successively smaller portions of the energy of said horizontal deflection wave during [one] *a first* interval of said vertical deflection and successively greater portions of said energy of said horizontal deflection wave during a second interval of said vertical deflection to said vertical deflection circuit for producing all of said sawtooth current in said vertical deflection winding, *said first and second intervals occurring during the trace portion of each vertical deflection* [interval] *cycle*

Claims 2–9, dependent on an amended claim, are determined to be patentable.

* * * * *